United States Patent
Krijn

(12) 
(10) Patent No.: US 6,326,629 B1
(45) Date of Patent: Dec. 4, 2001

(54) PROJECTION LITHOGRAPHY DEVICE UTILIZING CHARGED PARTICLES

(75) Inventor: Marcellinus P. C. M. Krijn, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/392,685

(22) Filed: Sep. 9, 1999

(30) Foreign Application Priority Data

Sep. 9, 1998 (EP) .................................................. 98203012

(51) Int. Cl.⁷ .................................................. H01J 37/302
(52) U.S. Cl. ..................................... 250/492.2; 250/396 R
(58) Field of Search ............................. 250/492.2, 396 R, 250/398

(56) References Cited

U.S. PATENT DOCUMENTS 4,472,636 * 9/1984 Hahn .................................. 250/492.2
5,863,682 * 1/1999 Abe et al. ......................... 250/492.2
5,892,231 * 4/1999 Baylor et al. ........................ 250/398

FOREIGN PATENT DOCUMENTS

0028585A1    5/1981  (EP) .
07142318A    6/1995  (JP) .

OTHER PUBLICATIONS

"Electron–Optical Design for the Scalpel Proof–of–Concept Tool", by W.K. Waskiewicz, et al., Proceedings of the SPIE 1995, XP 000856131.
Eric Munro and Henry P. Freund, "Electron–Beam Sources and Charged–Particle Optics", Proceedings of SPIE, vol. 2522, pp. 13–22, Jul. 10–14, 1995.

* cited by examiner

Primary Examiner—Kiet T. Nguyen
(74) Attorney, Agent, or Firm—Steven R. Biren

(57) ABSTRACT

An object (14) is imaged on an imaging surface (16) by means of a telescopic system of rotationally symmetrical electron lenses (10, 12). The imaging system includes two quadrupoles, each of which coincides with one of the two round lenses (10, 12), so that the electrons are concentrated in line-shaped focal spots instead of a (small) circular cross-over (18). The system remains telescopic to a high degree and the imaging remains stigmatic.

10 Claims, 4 Drawing Sheets

PROJECTION LITHOGRAPHY DEVICE UTILIZING CHARGED PARTICLES

BACKGROUND OF THE INVENTION

Projection lithography device utilizing charged particles.

The invention relates to a lithography device for carrying out projection lithography by means of a beam of charged particles, which device includes an imaging particle-optical system for imaging a lithographic object structure on a lithographic imaging surface by means of said beam, said particle-optical system including a substantially telescopic system with a first and a second round particle lens which are arranged to produce a first and a second rotationally symmetrical lens field, respectively.

A device of this kind is known from an article in Proceedings SPIE "Electron-Beam Sources and Charged-Particle Optics", Jul. 10–14, 1995, by W. K. Waskiewicz et al., entitled "Electron-Optical Design for the SCALPEL Proof-of-Concept Tools", published in SPIE, Vol. 2522, 1995.

SUMMARY OF THE INVENTION

Particle-optical imaging, notably electron-optical imaging, can be used for the lithographic manufacture of very small structures, such as integrated electronic circuits or masks for such circuits, with a resolution which is less than the wavelength of light.

The imaging of a lithographic object structure on a lithographic imaging surface by means of electrons can in principle be carried out in two ways: sequentially and non-sequentially. In the case of sequential imaging, the emissive surface of an electron source, or a part thereof, is imaged, at a strongly reduced scale, on the lithographic imaging surface on which the lithographic structure to be formed is to be provided. This image of the electron source (the "spot") is displaced across the object by means of, for example deflection coils, the electron beam being blanked or not during said displacement. The pixels of the pattern to be imaged are thus sequentially written onto the lithographic imaging surface. As the dimensions of the lithographic structure are larger, significantly more time will be required for the scanning writing of this structure, i.e. an increase in time in proportion to the surface area of the structure. Because nowadays in the integrated circuit technique there is a strong tendency to image increasingly larger structure, the throughput during the reproduction of integrated circuits decreases strongly, so that this method of imaging is becoming increasingly more objectionable.

In the case of non-sequential imaging, the lithographic object structure to be imaged is uniformly irradiated by means of the electron beam and a focusing lens system is used to form an image, reduced or not, of the lithographic object structure on the lithographic imaging surface. The pixels of the pattern to be imaged are thus simultaneously, i.e. not sequentially, projected onto the lithographic image surface. Therefore, this method of lithography is also called projection lithography.

The cited article describes a projection lithography method in which a lithographic object structure is imaged on a lithographic imaging surface by means of a system of rotationally symmetrical electron lenses. Such a lithographic object structure can be formed by a (comparatively large) rendition of a lithographic mask which is to be imaged on a lithographic imaging surface in order to derive the actual (much smaller) lithographic mask therefrom. The lithographic object structure to be imaged may also be formed by the actual mask, which is then imaged on the lithographic imaging surface (in that case being a wafer) in order to form integrated circuits therefrom. This known lithographic method is called SCALPEL® ("Scattering with Angular Limitation Projection Electron-beam Lithography". The imaging system of electron lenses therein is formed by two electron lenses, having a rotationally symmetrical lens field, which together constitute a telescopic system.

In the context of the present invention a telescopic system is to be understood to mean a system of lenses which converts an incident parallel beam into a parallel outgoing beam. The simplest form of such a system consists of two lenses having a common optical axis, the rear focus of one lens being coincident with the front focus of the other lens. Projection lithography requires a telescopic system, because a comparatively large lithographic object structure (having a diameter of the order of magnitude of 1 mm) must be completely imaged on the lithographic imaging surface. The edges of the structure should in principle be just as sharp as its center, which means that the imaging defects at the edges of the structure to be imaged may hardly be greater than those at the central parts. This condition can be optimally satisfied only if the imaging system is a telescopic system, so that for the present invention it is of essential importance to perform the imaging by means of such a system.

During the production of integrated circuits by means of projection lithography the throughput is determined by the magnitude of the current in the electron beam whereby the lithographic object structure to be imaged (so the mask to be imaged in the case of IC manufacture) is irradiated. A limit is imposed as regards the current in the electron beam because the electrons in the beam repel one another (the so-called Coulomb interaction), causing an energy spread of the electrons in the beam and distortion of the beam. Both effects are greater as the current in the electron beam is larger, and cause imaging defects by the imaging system. The imaging defects may not exceed a specified value, so that an upper limit is also imposed as regards the current in the beam, and hence also as regards the throughput of the integrated circuits to be produced.

The described repulsion effect is strongest in the part of the electron beam where the spacing of the electrons in the beam is small, i.e. at the area of a cross-over in the electron beam. Such a cross-over occurs between said two round lenses which together constitute the telescopic system, that is to say at the area of the coincident focal points of the two lenses. Even though it may occur that cross-overs are also formed in the electron beam ahead of the telescopic system, such cross-overs do not have an effect on the (geometrical) imaging defects, because they are situated in the irradiating part of the beam and do not occur in the imaging beam path between the object (the lithographic object structure) and the image (the lithographic imaging surface).

OBJECTS AND SUMMARY OF THE INVENTION

It is an object of the invention to make said limitation of the current in the electron beam less severe, and hence increase the throughput during the production of integrated circuits.

To this end, the lithographic device according to the invention is characterized in that the particle-optical system includes first quadrupole means and second quadrupole means which are arranged to produce a first and a second quadrupole field, respectively, the converging effects of said quadrupole fields on the beam intersecting one another at substantially right angles, said first and second quadrupole fields being substantially coincident with the first and the second rotationally symmetrical lens field, respectively, the strength of the quadrupole fields being such that the lithographic object structure to be imaged is stigmatically imaged on the lithographic imaging surface.

As is known from particle optics, a quadrupole field has a purely converging effect on a beam of charged particles in a first plane containing the optical axis whereas it has a purely diverging effect in a plane which extends perpendicularly thereto and contains the optical axis. When two successive quadrupoles are rotated 90° relative to one another, the converging effect of the first quadrupole will be directed perpendicularly to the converging effect of the next quadrupole. However, it may be that a rotation of the beam about the optical axis takes place between the two quadrupoles (as it occurs upon passage through a rotationally symmetrical magnet field), so that the next quadrupole would have to be rotated through the same angle in order to keep its converging effect perpendicular to that of the first quadrupole. Because stigmatic imaging by two quadrupoles is possible only if the diverging effect of one quadrupole is compensated by the converging effect of the other quadrupole (and vice versa), in the context of the present invention the described situation is that in which quadrupole fields have converging effects which intersect one another at right angles.

In order to obtain a stigmatic image despite the described arrangement of the quadrupoles, the strengths of the quadrupoles generally will not be completely equal. Because of this arrangement and the unequal strengths, the magnification in one plane through the optical axis (the x–z plane) will deviate slightly from that in a plane which extends perpendicularly thereto and through the optical axis (the y–z plane). If this phenomenon is undesirable, this inequality can be compensated by changing the length-to-width ratio of the lithographic object structure to be imaged in the same ratio; this can be readily done because such object structures are always designed by means of a computer, so that this changed ratio can be simply taken into account.

It is to be noted that from Japanese patent application 5-286948, published on Jun. 2, 1995 (filed on Nov. 16, 1993, publication No. 7-142318), it is known per se to counteract the Coulomb interaction in an electron beam traversing a lens system by distorting a cross-over by means of two quadrupoles which are arranged at the area of the cross-over in order to form a beam structure having an enlarged beam cross-section. The imaging systems known from the cited document, however, are intended to form a spot shape for a sequential imaging application (so the scanning exposure of the lithographic imaging surface). According to the method described in the cited document the desired spot shape is obtained by imaging a beam-limiting gap onto a second beam-limiting gap and by imaging this assembly in its turn onto a lithographic imaging surface. It will be evident that this is not a matter of projection lithography and, therefore, the cited document does not offer any hints as to which steps are required so as to maintain the telescopic nature when quadrupoles are added in projection lithography.

The invention is based on the recognition of the fact that, when quadrupoles are added, the telescopic nature of the imaging particle-optical system, being of crucial importance, can be preserved only if the first quadrupole is substantially coincident with the first lens and the second quadrupole is substantially coincident with the second lens. The excitation of each of the quadrupoles must be adjusted in such a manner that the image is stigmatic. If the original distance between the rotationally symmetrical lenses is to be maintained, the excitation of the second round lens (being the lens situated nearest to the image) must be adapted slightly (to the order of magnitude of some tenths of a percent) in order to maintain the telescopic nature of the system thus formed.

DESCRIPTION OF THE PREFERRED EMBODIMENTS

In a preferred embodiment of the lithography device according to the invention, the various parameters of the imaging particle-optical system have the values stated in claim 2. Simulation of the beam path is this embodiment reveals that for the interval defined for the parameter a (i.e. $0.01<|a|<0.1$) in this embodiment the ratio of the magnification in the x–z plane $M_x$ to that in the y–z plane $M_y$ is still acceptable; outside this interval the ratio deviates too much from the value 1 for all practical purposes.

In a further preferred embodiment of the lithography device according to the invention, the various parameters of the imaging particle-optical system have the values stated in claim 3. Simulation of the beam path in this embodiment reveals that for the value defined for the parameter a in said Claim the current in the beam may be approximately 2.65 times larger than the beam current in a similar system without quadrupoles. This also implies an increase of the throughput by the same factor.

Further advantageous embodiments of the invention are disclosed in the other Claims.

BRIEF DESCRIPTION OF THE DRAWINGS

The invention will be described in detail hereinafter with reference to the Figures in which corresponding reference numerals denote corresponding elements. Therein:

FIG. 1 is a diagrammatic representation of a state of the art imaging particle-optical system for imaging a lithographic object structure on a lithographic imaging surface. In this Figure an electron beam is produced by an electron source 2. The electron beam travels through the lens system along an optical axis 4. The system shown also consists of two round (i.e. rotationally symmetrical) lenses 8 and 10 whose axes coincide with the optical axis of the system. Even though this Figure shows these round lenses in the form of gap lenses, they may also be constructed as immersion lenses or so-called VAL lenses. (Variable Axis Lenses). The optical axis in a VAL lens may be shifted slightly parallel to itself by arranging one or two dipoles in the lens; these dipoles realize a field distribution perpendicularly to the optical axis. Both lenses 10 and 12 image a lithographic object structure 14 to be imaged, for example a lithographic mask, on a lithographic imaging surface 16, for example a wafer on which integrated circuits are to be formed. In the system shown, the focal length $f_1$ of the lens 10 equals 160 mm., like the distance $d_1$ from the mask 14 to the lens 10. The focal length $f_2$ of the lens 12 equals 40 mm, like the distance $d_2$ from the lens 12 to the surface of the wafer 16 to be irradiated. It appears from these numbers that the mask is imaged on the wafer with a reduction factor amounting to 160:40=4:1. When the ratio of the diameter of the bore to the gap (bore to gap ratio) of the two lenses is chosen to be equal and the excitation of these lenses is equal but opposed, this system will cause hardly any or no image rotation.

Figure 1:
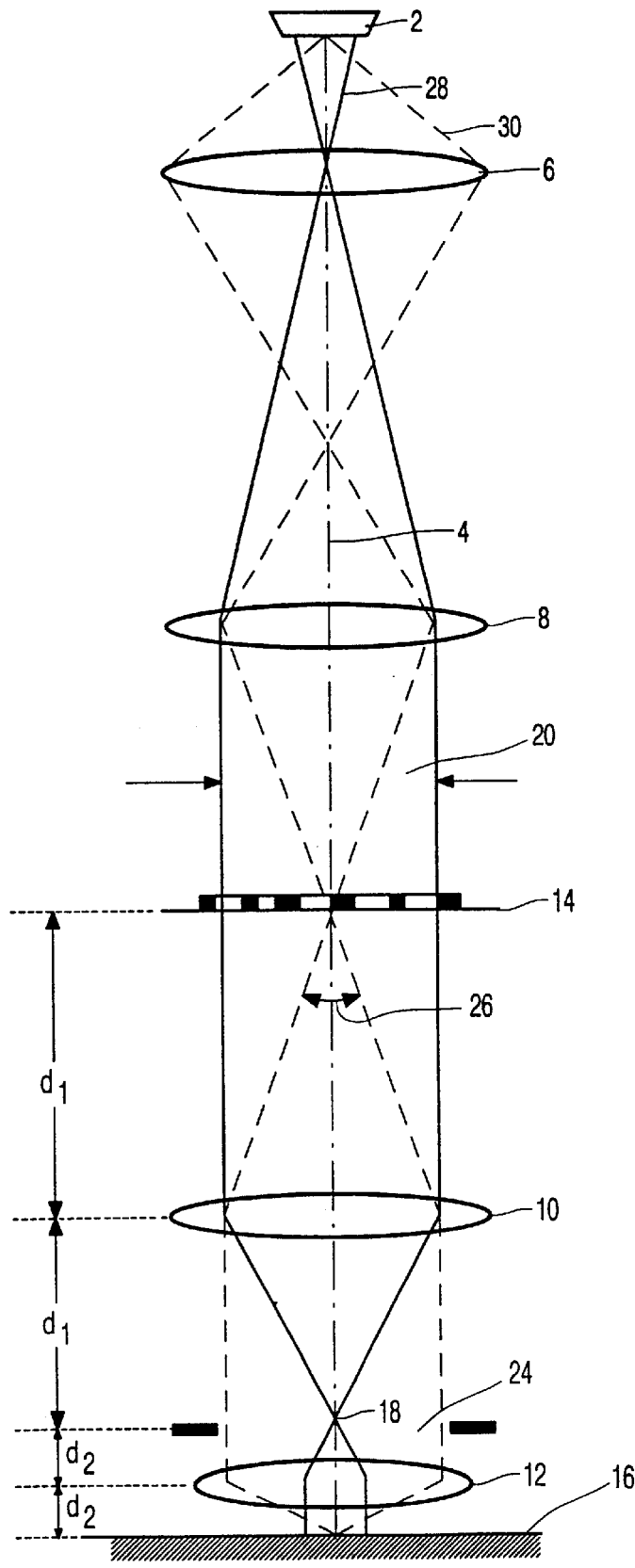
FIG. 1 is a diagrammatic representation of an imaging particle-optical system for the imaging of a lithographic object structure on a lithographic imaging surface according to the present state of the art.

The mask 14 to be imaged on the surface of the wafer 16 is irradiated by means of two condensor lenses 6 and 8 which form a more or less parallel beam of a width of approximately 1 mm at the area of the beam cross-section 20, that is to say at the area of the mask 14. This Figure also shows a round beam-limiting diaphragm 24 which has a diameter of 160 μm at the area of the coincident focal points of the lenses 10 and 12. From the stated values of the focal length $f_1$ of the lens 10 and the diameter of the diaphragm 24 it also follows that the angle of aperture 26 of the electron beam equals 1 mrad.

FIG. 1 shows two beam paths: the beam path of the irradiating beam 28 (shown in solid lines) and that of the imaging beam 30 (shown in dashed lines). Even though the irradiating beam and the imaging beam are not separate beams but form part of the beam of electrons emanating from the source 2, a distinction is made between the two imaginary beams 28 and 30 so as to elucidate the different functions(irradiation and imaging). The rays of the irradiating beam 28 are incident in parallel on the mask 14 via the condensor system 6, 8. The parallel rays are focused, via the lens 10, in the common focal plane of this lens and the lens 12, after which they emanate in parallel again from the lens 12 so as to travel in the direction of the imaging surface 16. Via the condensor system 6, 8, the rays of the imaging beam 30 are incident on the mask 14 in a non-parallel manner. Consequently, the mask 14 is imaged in infinity by the lens 10, i.e. the rays emanating from a given point of the mask 14 emanate from the lens 10 as a parallel beam. The lens 12 focuses this parallel beam on the imaging surface 16 which coincides with the rear focus of the lens 12. The mask 14 irradiated by the beam 28 is thus imaged on the imaging surface 16.

Between the two lenses 10 and 12, together constituting the telescopic system, a cross-over 18 is formed at the area of the coincident focal points of the two lenses. Thus, the highest spatial concentration of electrons between the lenses 10 and 12 occurs at this point in the beam path, so within the aperture of the round beam-limiting diaphragm 24 which has a diameter of 160 μm. The dimension of the diaphragm 24 is determined by the required angle of aperture of the imaging beam, which angle of aperture itself is imposed by the permissible imaging defects, so by the desired resolution of the image.

Figure 2A:
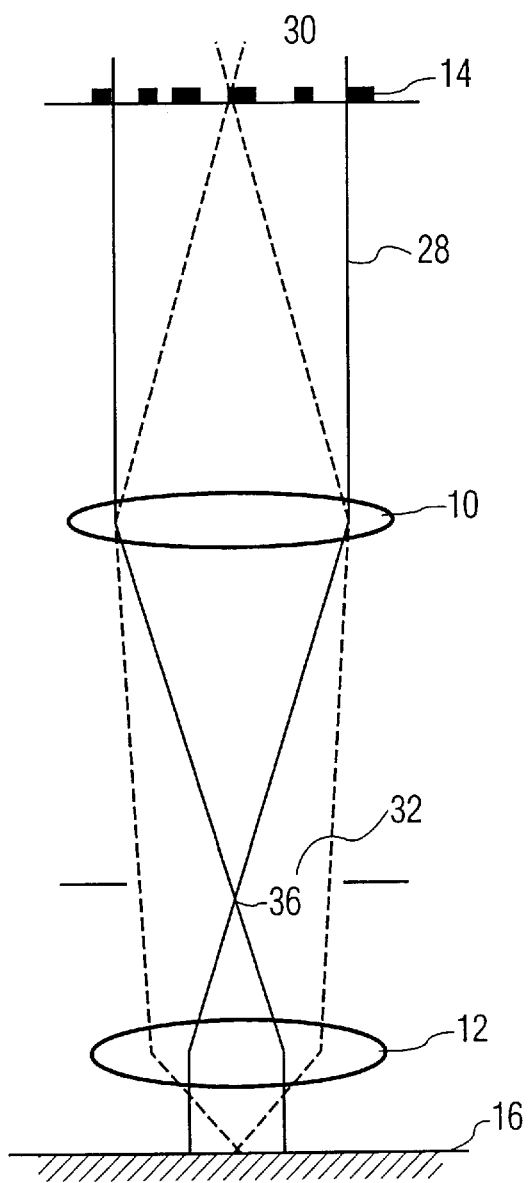
FIG. 2 is a diagrammatic representation of an imaging particle-optical system as shown in FIG. 1 which is provided with quadrupole means according to the invention.
Figure 2B:
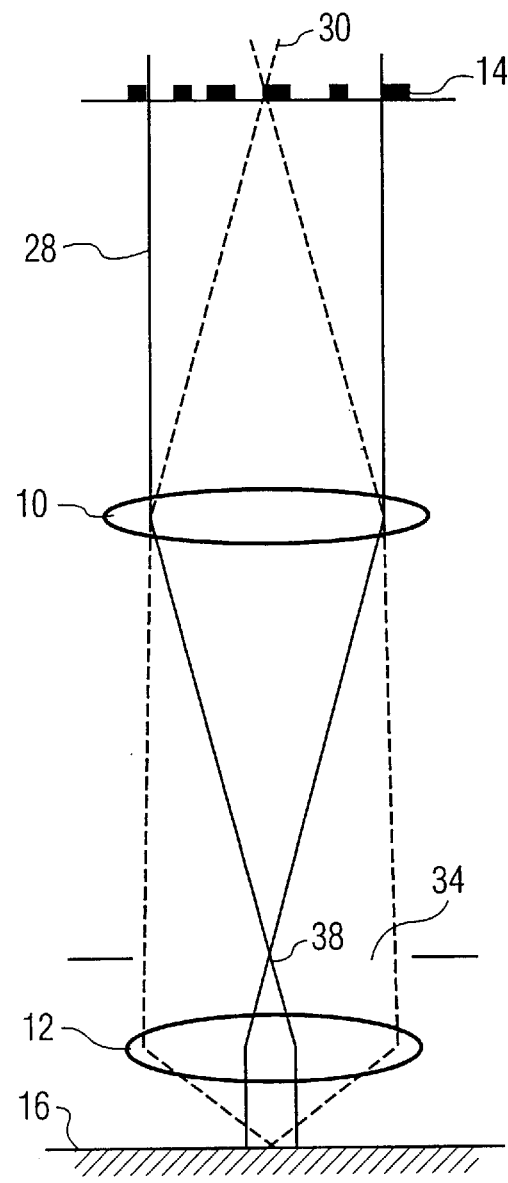

FIG. 2 is a diagrammatic representation of a modification of the imaging system shown in FIG. 1. This modification implies that the system of FIG. 1 is extended with two quadrupoles in conformity with the invention. These quadrupoles coincide with the two round lenses 10 and 12, having the effect that the strength of the lens 10 has apparently increased slightly and the strength of the lens 12 has decreased slightly in one plane through the optical axis (the x–z plane), whereas in the plane through the optical axis perpendicular thereto the strength of the lens 10 has apparently decreased slightly and the strength of the lens 12 has increased slightly. The two quadrupoles are not explicitly shown in FIG. 2, but their presence is indicated by a larger or smaller curvature of the two lenses 10 and 12, indicating the increased and decreased strength, respectively. Due to the presence of these two quadrupoles, two mutually perpendicular focal lines 36 and 38 appear instead of the original cross-over 18 in FIG. 1. Accordingly, the originally round diaphragm 24 of FIG. 1 is replaced in FIG. 2 by two mutually perpendicular gaps which have the same direction as the associated focal lines, i.e. the gap 32 for the x–z plane and the gap 34 for the y–z plane.

The original projection system of FIG. 1 is telescopic, i.e. the transfer matrix T of this system has the following form:

$$T = \begin{pmatrix} \frac{1}{M} & 0 \\ C & M \end{pmatrix} \quad (1)$$

in which M is the angular magnification of the system and C=0. In the present system M=–4.

In the modified system of FIG. 2, C can no longer be exactly equal to zero but, since C remains small, the image quality on the imaging surface 16 is not noticeably influenced thereby. The angular magnifications in the x–z plane and the y–z plane thus become slightly unequal, but this inequality can be compensated by changing the length-to-width ratio of the lithographic object structure to be imaged in the same ratio.

In order to determine the parameters holding for the system shown in FIG. 2, the following quantities are defined: $f_1$ and $f_2$ are the focal lengths of the lens 10 and the lens 12, respectively; $d_1$ is the distance from the mask 14 to the lens 10; $d_2$ is the distance from the lens 12 to the imaging surface 16; $q_1$ and $q_2$ are the focal lengths of the quadrupole coinciding with the lens 10 and of the quadrupole coinciding with the lens 12, respectively. Also defined are the quantities $M_x$ and $M_y$ which represent the angular magnification in the x–z plane and the angular magnification in the y–z plane, respectively, and the quantity $C_x$ (see the expression 1)) for the imaging in the x–z plane and the quantity $C_y$ for the imaging in the y–z plane. In the system shown in FIG. 2, in which $f_1=d_1$ is chosen again, the aim is for stigmatic imaging (i.e. the focusing in the x–z plane takes place in the same way as the focusing in the y–z plane) on the specified imaging surface 16, the image being kept in telescopic form as much as possible. Subject to these conditions the following expressions can be derived for $f_2$ and $q_2$;

$$f_2 = \frac{d_2(d_1^2 + 2d_1d_2 + d_2^2 - q_1^2)}{d_1^2 + 3d_1d_2 + 2d_2^2 - q_1^2} \text{ and} \quad (2)$$

$$q_2 = \frac{-d_1^2 - 2d_1d_2 - d_2^2 + q_1^2}{q_1} \quad (3)$$

For these settings it holds for the quantities $M_x$, $C_x$, $M_y$ and $C_y$ that:

$$M_x = \frac{d_1(d_1 + d_2 - q_1)}{d_2 q_1} \quad (4)$$

$$C_x = \frac{(d_1 + d_2)(d_1^2 + d_1(d_2 - q_1) + d_2 q_1)}{d_1 d_2 q_1 (d_1 + d_2 - q_1)} \quad (5)$$

$$M_y = -\frac{d_1(d_1 + d_2 + q_1)}{d_2 q_1} \quad (6)$$

-continued $$C_y = -\frac{(d_1 + d_2)(d_1^2 - d_2 q_1 + d_1(d_2 + q_1))}{d_1 d_2 q_1 (d_1 + d_2 + q_1)} \quad (7)$$

When $d_1$=160 mm, $d_2$=40 mm and $q_1$=1600 mm are chosen, the values of the various parameters will be as stated in the following Table I:

TABLE I

|  | Quantity | Value |
| --- | --- | --- |
| Given | $d_1$ | 160 mm |
|  | $d_2$ | 40 mm |
|  | $f_1$ | 160 mm |
|  | $q_1$ | 1600 mm |
| Result | $f_2$ | 40.13 mm |
|  | $q_2$ | 1575 mm |
|  | $M_x$ | −3.5 |
|  | $C_x$ | 0.0022 mm$^{-1}$ |
|  | $M_y$ | −4.5 |
|  | $C_y$ | −0.0024 mm$^{-1}$ |

It follows from the above Table I that the focal length $f_2$ and the lens 12 must be approximately 0.3% larger. It also appears that the magnifications in the x–y plane and in the y–z plane deviate 12.5% from the nominal value M=4.

Even though FIG. 2 shows the beam 28 behind the condensor lens 8 (so in the region of the mask 14 and the lenses 10 and 12) as a parallel beam, due to the desired angle of aperture this beam in reality exhibits the angular spread associated with the relevant angle of aperture, said spread amounting to 1 mrad in a practical situation. For the crossover 18 this results in a dimension of 160 μm, which is also the transverse dimension of each of the gaps 32 and 34. The main function of these two gaps is the interception of electrons which have been scattered in the optical path over thee gaps, so that they would actually miss the actual crossover and reduce the resolution because of their imaging defects.

It will be evident that, due to the occurrence of the focal lines 36 and 38, the smallest cross-section of the electron beam will be situated approximately halfway between the two focal lines. The enlargement of the beam cross-section due to the astigmatism of a quadrupole can be simply estimated; this is also the dimension of this smallest cross-section. An approximative value in this respect is:

$$D \approx d \frac{f_1}{q_1} \quad (8)$$

in which d is the diameter of approximately 1 mm of the beam in the vicinity of the mask 14. Using the values stated in the Table, it follows that D=100 μm. Because the angular spread of the beam already causes a dimension of the focal lines of approximately 160 μm, the total diameter of the beam between the two focal lines 36 and 38 becomes equal to 260 μm. Because the original crossover 18 in FIG. 1 amounted to 160 μm, the surface area of the cross-section of the beam has thus increased by a factor of $(260/160)^2 \approx 2.65$. The permissible current in the beam, therefore, can increase by the same factor, so that the throughput during the production of integrated circuits can also increase by a similar factor.

Figure 3:
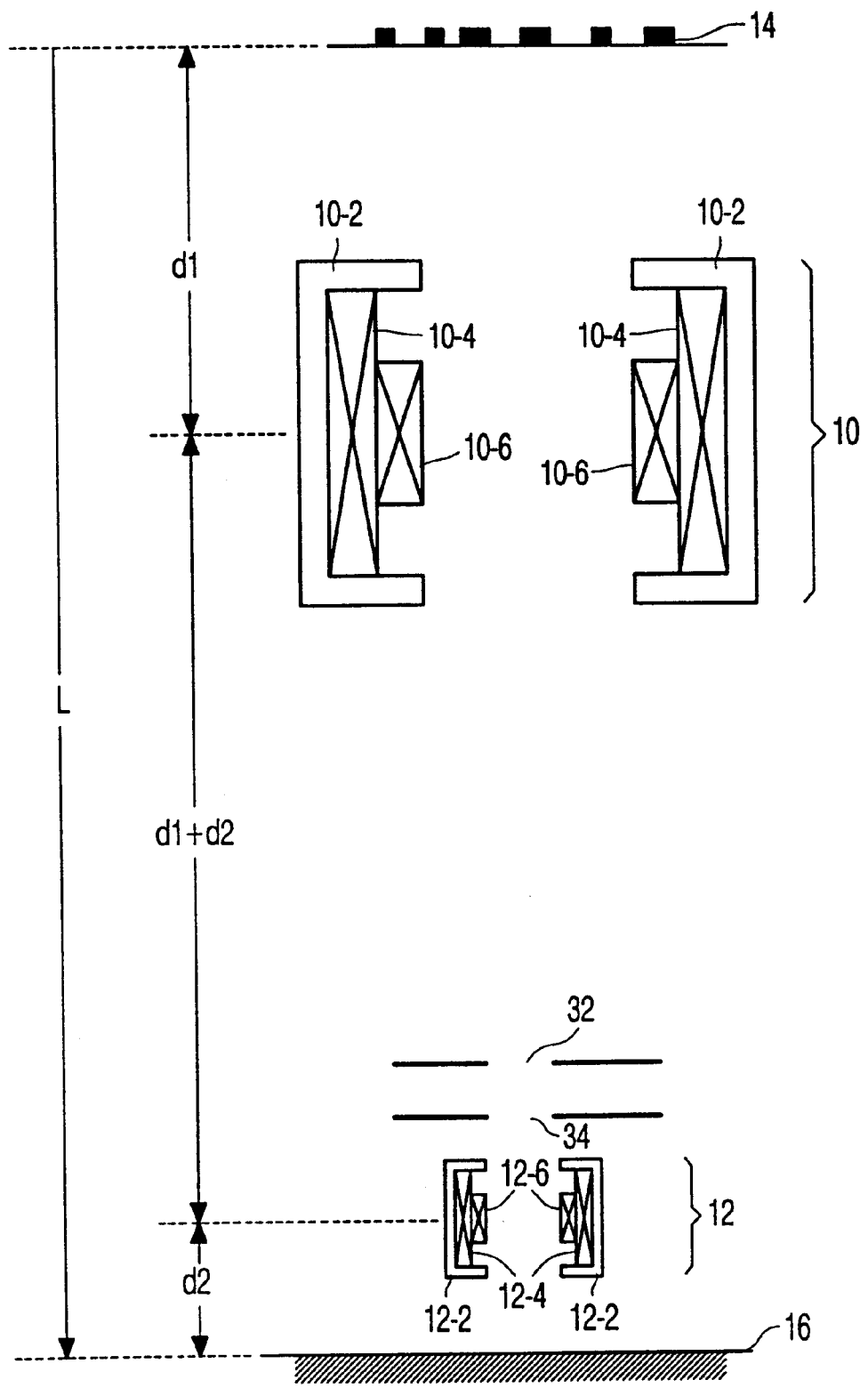
FIG. 3 is a diagrammatic representation of the particle-optical system of FIG. 2 which shows the arrangement of the quadrupoles in the round lenses.

FIG. 3 shows the particle-optical system of FIG. 2 so as to illustrate the arrangement of the quadrupoles in the round lenses. The first round lens 10 consists of an iron circuit 10-2 for concentrating the magnetic field generated by the coil 10-4 in the vicinity of the optical axis. Within this round lens there are also arranged the quadrupole means, in this Figure being diagrammatically represented by a coil 10-6. The second round lens 12 has the same structure as the first round lens 10 and consists of an iron circuit 12-2. The quadrupole means, again diagrammatically represented by a coil 12-6, are also arranged within this round lens. The quadrupole means 10-6 and 12-6 may each have a known shape. They may be constructed so as to include four physical poles for generating the desired quadrupole field, but may also be constructed in the form of multipoles, for example eight-poles, ten-poles or twelve-poles which, using a suitably chosen excitation, can generate the desired quadrupole fields as well as higher-order fields for the correction of imperfections in the quadrupole field. When the quadrupole fields are generated by physical ten-poles or twelve-poles, it is possible to shift the optical axis of said element parallel to itself. In that case the quadrupole can be advantageously used in combination with the VAL lens mentioned with reference to FIG. 1. It is thus possible to shift the optical axis of the quadrupole simply with that of the VAL lens.

Figure 4:
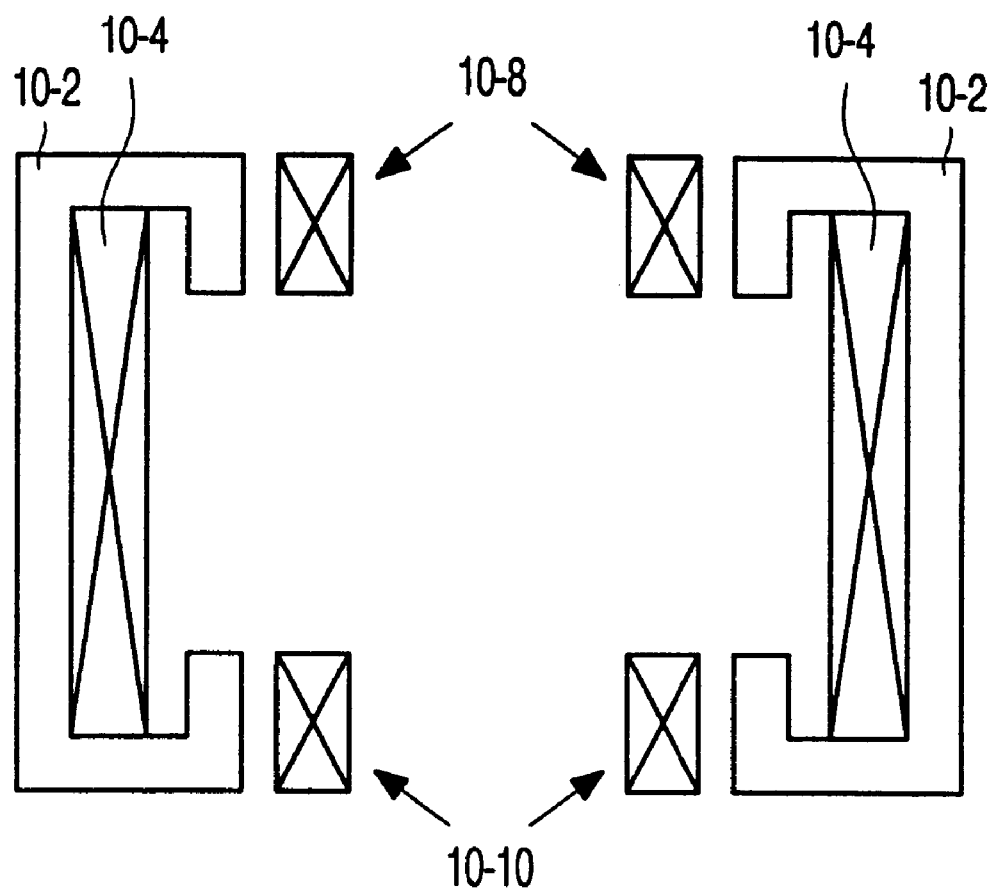
FIG. 4 is a diagrammatic representation of a round lens of the particle-optical system of FIG. 2 which shows an alternative arrangement of the quadrupole.

FIG. 4 shows an alternative in respect of the arrangement of the quadrupole in the round lens. The quadrupole in this embodiment is split into two equal parts 10-8 and 10—10 in the direction of the optical axis. These two parts can be identically excited in such a manner that the overall quadrupole strength of the two parts together equals that of the single quadrupole shown in FIG. 3. This configuration can be chosen when the single quadrupole would be excessively subject to the effects of the magnetic field of the round lens 10.

Claims:

1. A lithography device for carrying out projection lithography by means of a beam of charged particles, which device includes an imaging particle-optical system for imaging a lithographic object structure (14) on a lithographic imaging surface (16) by means of said beam of charged particles, said particle-optical system including a substantially telescopic system with first and second round particle lenses (10, 12) which are arranged to produce first and second rotationally symmetrical lens fields, respectively, characterized in that the particle-optical system includes first quadrupole means (10-6) and second quadrupole means (12-6) which are arranged to produce first and second quadrupole fields, respectively, converging effects of said quadrupole fields on the beam intersecting one another at substantially right angles, said first and second quadrupole fields being substantially coincident with the first and the second rotationally symmetrical lens fields, respectively, the strength of the quadrupole fields being such that the lithographic object structure to be imaged is stigmatically imaged on the lithographic imaging surface.

2. A lithography device as claimed in claim 1, in which $q_1 = f_1/a$, $q_2 = \{(1/a)-(25a/16)\}f_1$ and $f_2 = \{(16-25a^2)/(64-120a^2)\}f_1$, where $q_1$=the focal length of the first quadrupole means, $f_1$=the focal length of the first round particle lens, a=a parameter whose absolute value lies between 0.01 and 0.5, $q_2$=the focal length of the second quadrupole means, and $f_2$=the focal length of the second round particle lens.

3. A lithography device as claimed in claim 2, in which $s=1.25f_1$, $d_1=f_1$, $d_2=f_1/4$, $q_1=10\,f_1$ and $a=0.1$, where s=the distance between the first and the second round particle lens, $d_1$=the distance between the lithographic object structure and the first round particle lens, $d_2$=the distance between the lithographic imaging surface and the second round particle lens.

4. A lithography device as claimed in claim 1, in which the first and the second quadrupole means form two mutually perpendicular focal lines (36, 38) and in which two parallel, mutually perpendicular gaps (32, 34) are provided between the two round lenses at the area of said focal lines.

5. A lithography device as claimed in claim 4, in which the width of each of the gaps lies between 100 and 200 µm.

6. A method of manufacturing an integrated electronic circuit in which a projection lithographic image of a lithographic object structure (14) is formed on a lithographic imaging surface (16) forming part of the integrated electronic circuit by means of a beam of charged particles, which image is realized by means of a substantially telescopic particle-optical system which includes first and second rotationally symmetrical lens fields said method comprising the steps of subjecting the imaging beam to effects of first and second quadrupole fields respectively, converging the effects of said quadrupole fields on the beam to intersect one another at substantially right angles, causing said first and second quadrupole fields to be substantially coincident with the first and the second rotationally symmetrical lens fields, respectively, and adjusting the strength of the quadrupole fields so that the lithographic object structure to be imaged is stigmatically imaged on the lithographic imaging surface.

7. A method as claimed in claim 6, in which such a strength is imparted to the rotationally symmetrical lens fields and the quadrupole fields that $q_1=f_1/a$, $q_2=\{(1/a)-(25a/16)\}f_1$ and $f_2=\{(16-25a^2)/<64-120a^2)\}f_1$, where $q_1$=the focal length of the first quadrupole field, $f_1$=the focal length of the first rotationally symmetrical lens field, a=a parameter whose absolute value lies between 0.01 and 0.5, $q_2$=the focal length of the second quadrupole field, and $f_2$=the focal length of the second rotationally symmetrical lens field.

8. A method as claimed in claim 7, in which the distances between the elements to be imaged and the imaging elements are such that $s=1.25f_1$, $d_1=f_1$, $d_2=f_1/4$, $q_1=10f_1$ and $a=0.1$, where s=the distance between the center of the first rotationally symmetrical lens field and the center of the second rotationally symmetrical lens field, $d_1$=the distance between the lithographic object structure and the center of the first rotationally symmetrical lens field, $d_2$=the distance between the lithographic imaging surface and the center of the second rotationally symmetrical lens field.

9. A method as claimed in any one of claim 6, in which the first and the second quadrupole fields form two mutually perpendicular focal lines (36, 38) and in which two parallel, mutually perpendicular gaps (32, 34) are provided between the two rotationally symmetrical lens fields at the area of said focal lines.

10. A method as claimed in claim 9, in which the width of each of the gaps lies between 100 and 200 µm.

\* \* \* \* \*